United States Patent
Heijna et al.

(10) Patent No.: US 6,661,300 B2
(45) Date of Patent: Dec. 9, 2003

(54) RING OSCILLATOR AND MEANS FOR CONTROLLING THE FREQUENCY THEREOF

(75) Inventors: Roeland John Heijna, Nijmegen (NL); Johannes Petrus Antonius Frambach, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/118,872

(22) Filed: Apr. 9, 2002

(65) Prior Publication Data

US 2002/0163393 A1 Nov. 7, 2002

(30) Foreign Application Priority Data

Apr. 12, 2001 (EP) .............................................. 01201341

(51) Int. Cl.[7] .............................................. H03B 27/00
(52) U.S. Cl. ...................... 331/57; 327/156; 369/60.01; 360/39; 360/51
(58) Field of Search ........................... 331/57; 327/156; 369/60.01; 360/39, 51

(56) References Cited

U.S. PATENT DOCUMENTS 5,418,498 A    5/1995   DeVito et al. ................. 331/57
6,285,262 B1 * 9/2001   Kuriyama .................... 331/25

FOREIGN PATENT DOCUMENTS

EP    0964516    12/1999   ......... H03K/3/0231

* cited by examiner

Primary Examiner—Arnold Kinkead
(74) Attorney, Agent, or Firm—Aaron Waxler

(57) ABSTRACT

A ring oscillator according to the invention comprises a closed chain of at least two modules (1, 2). At least one of the modules (1, 2) comprises a primary (10) and a second amplifier stage (11) and combination means (12) for combining output signals of the primary (10) the secondary amplifier stage (11) so as to generate an output signal of the module. The amplifier stages (10, 11) have a mutually different delay and the primary (10) and the secondary am amplifier stage (11) are each coupled to an input (13) of the module (1). The ring oscillator further comprises a control unit (4) for generating a first (C1) and a second auxiliary control signal (C2) for controlling the amplification of the primary amplifier stage (10) and the secondary amplifier stage (11) in response to an input control signal (Co) representative for a desired frequency for the ring oscillator. The ring oscillator according to the invention is in particular suitable for application in a data and clock recovery unit (DCR), for example in a receiver for a transmission channel and a device fair reproducing an information carrier.

8 Claims, 4 Drawing Sheets

RING OSCILLATOR AND MEANS FOR CONTROLLING THE FREQUENCY THEREOF

FIELD OF THE INVENTION

The invention pertains to a ring oscillator comprising a closed chain of at least two modules.

The invention also pertains to a detector.

The invention further pertains to a receiver.

The invention further pertains to a device for reproducing an information carrier.

BACKGROUND OF THE INVENTION

Ring oscillators are widely used. Such oscillators comprise a closed chain of at least two modules having an open loop gain of 1 and a total phase shift of 360°. In many applications it is desirable that the frequency at which the ring oscillator operates is controllable.

SUMMARY OF THE INVENTION

It is a purpose of the invention to provide a means for controlling the frequency of the ring oscillator. According to the invention at least one of the modules comprises a primary and a secondary amplifier stage and combination means for combining output signals of the primary and the secondary amplifier stage so as to generate an output signal of the module, the amplifier stages having a mutually different delay, the primary and the secondary amplifier stage each being coupled to an input of the module, the ring oscillator further comprising a control t for generating a first and a second auxiliary control signal for controlling the amplification of the primary amplifier stage and the secondary amplifier stage in response to an input control signal representative for the desired frequency for the ring oscillator.

In the ring oscillator of the invention the frequency can be easily controlled, by means of the control unit. In response to the input control signal the control unit generates a first and a second auxiliary control signal which control the amplification of the primary and the secondary amplifier stage. As the amplifier stages have a different delay this also causes a difference in the oscillation frequency of the ring oscillator. If for example the secondary amplifier stage has a higher delay an increase of the amplification of the secondary amplifier stage in combination with a decrease of the amplification of the primary amplifier stage will result in a lower oscillation frequency.

Although in principle it is sufficient if only one of the modules is arranged with such a parallel circuit according to the invention, the best controllability is obtained if eah of the modules comprises such a parallel circuit. Prefereably the modules are identical. In that case they may each be controlled by the same control unit.

With a ring oscillator according to the invention comprising two modules the frequency can be tuned within a ratio $$\frac{f_{max}}{f_{min}} \approx 5/3,$$

wherein $f_{max}$, and $f_{min}$ resp. are the maximum and the minimum attainable frequency. If the ring oscillator according to the invention comprises three stages this ratio amounts about 2.

The ratio can be further increased by adding additional modules. This is however not necessary as the frequency range can be easily further extended by means of dividers.

Claim 2 describes a practical embodiment. The delay means may be implemented in various ways, for example by a RC network. The RC network need not comprise a separate capacitor, but may use parasitic capacitances of the active elements of the amplifier instead.

BRIEF DESCRIPTION OF THE DRAWING

These and other aspects of the invention are described in more detail with reference to the drawing. Therein FIG. 1 schematically shows a ring oscillator according to the invention.

DETAILED DESCRIPTION OF THE PRIMARY EMBODIMENT

Figure 1:
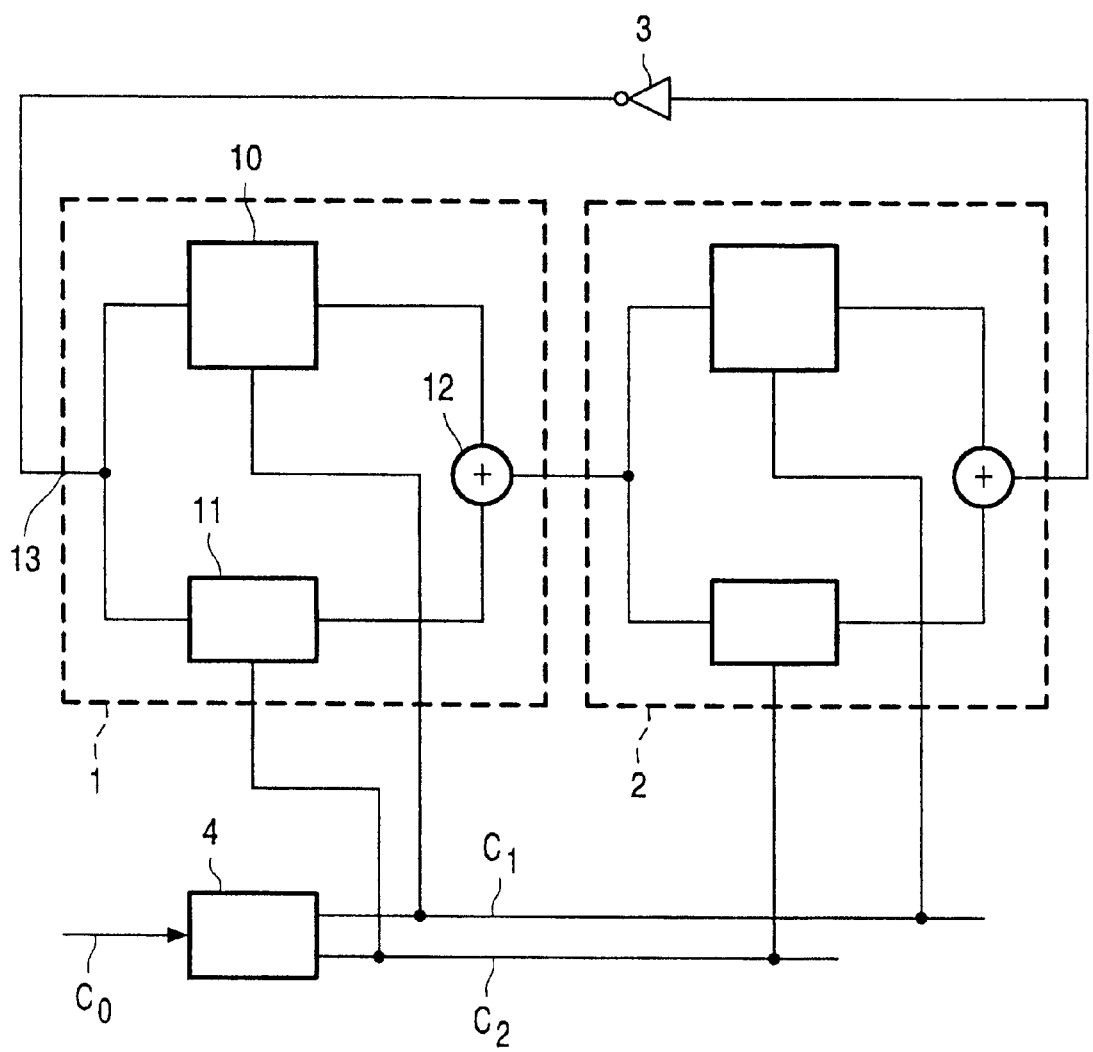

FIG. 1 schematically shows a ring oscillator comprising a first and a second module 1, 2. However in another embodiment the ring oscillator may comprise more modules. As shown in FIG. 1, the second module 2 is coupled tote first module 1 and the first module 1 is invertedly coupled to the second module. In the embodiment shown each of the modules comprises a primary and a secondary amplifier stage 10, ii and combination means 12 for combining output signals of the primary 10 and the secondary amplifier stage 11 so as to generate an output signal of the module 10. The amplifier stages 10, 11 have a mutually different delay. The primary and the secondary amplifier stage 10, 11 are each coupled to an input 13 of the module. The second module 2 is identical to the first module 10. The ring oscillator further comprises a control unit 4 for generating a first and a second auxiliary control signal C1, C2 for controlling the amplification of the primary amplifier stage 10 and the secondary amplifier stage 12 in response to an in input control signal C0 which is representative for the desired frequency for the ring oscillator.

Figure 2:
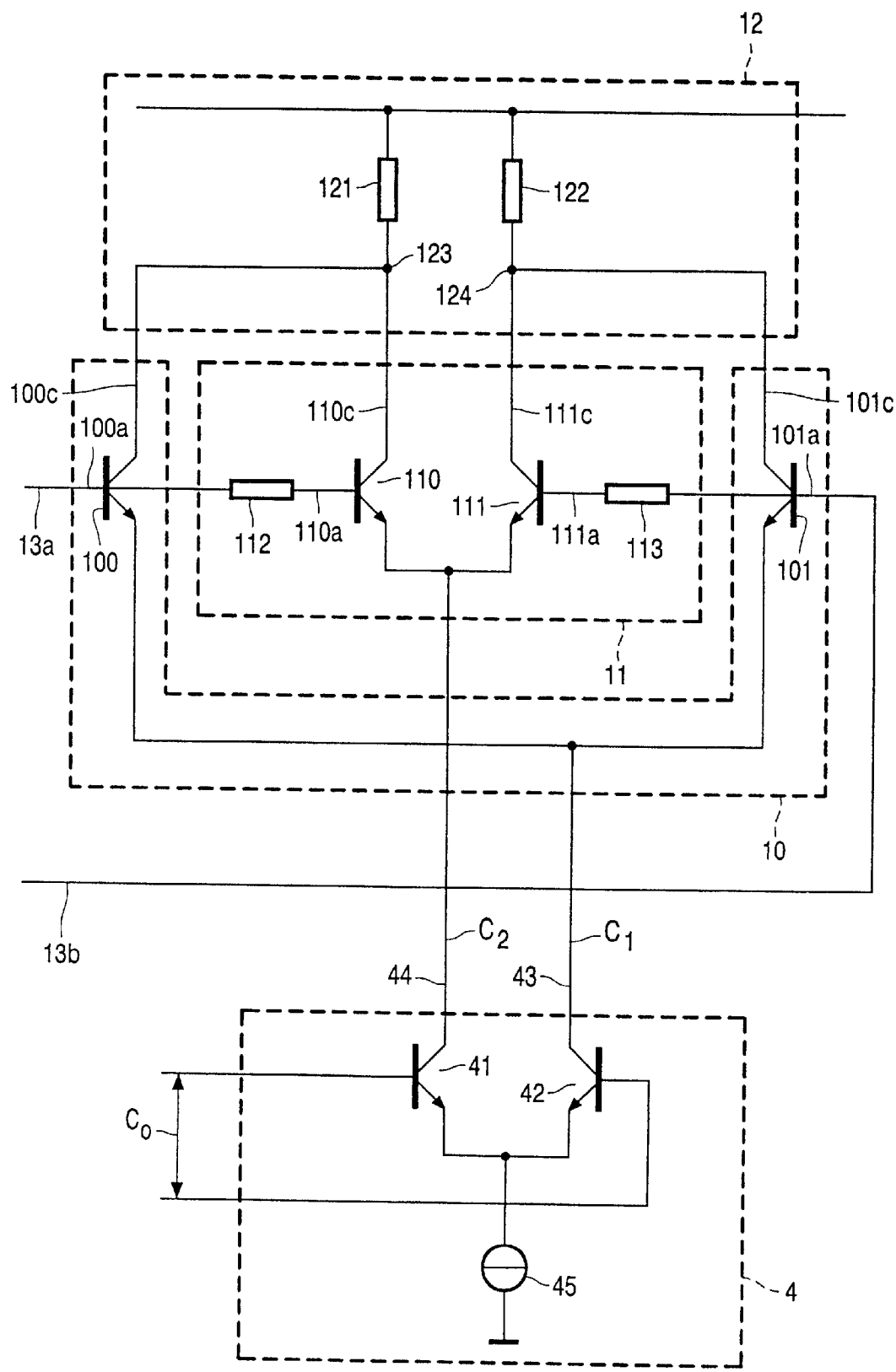
FIG. 2 shows a portion of an embodiment of the oscillator of FIG. 1 in more detail.

FIG. 2 shows the first module 1 and the control unit in more detail. As shown therein the primary amplifier stage 10 and the secondary amplifier stage 11 are formed by differential amplifiers. The differential amplifier forming the primary amplifier stage 10 comprises a first and a second controllable semiconductor element 100, 101. Likewise, the differential amplifier forming the secondary amplifier stage 11 comprises a first and a second controllable semiconductor element 110, 111. The secondary amplifier stage 11 has a first and a second input 110a, 111a which is coupled via a first and a second delay means to a first and a second input 100a, 101a of the primary amplifier stage 10. The delay means are formed here by the resistive elements 112, 113. In combination with the parasitic capacitances of the controllable semiconductor elements 110, 111 they cause a delay of the input signal of the secondary amplifier stage 11. Each of the differential amplifiers 100, 101; 110, 111 is supplied by a respective branch 43, 44 of an auxiliary differential amplifier 41, 42, which is supplied by a current source 45. The differential amplifier of the primary amplifier stage has a first and a second output 100c, 101c. Likewise, the differential amplifier of the secondary amplifier stage has a first and a second output 110c, 11c. The combination means 12 are formed by a first common node 123 which connects the first outputs 100c, 110c and a second common node 124 which connects the second outputs 101c, 111c.

Figure 3:
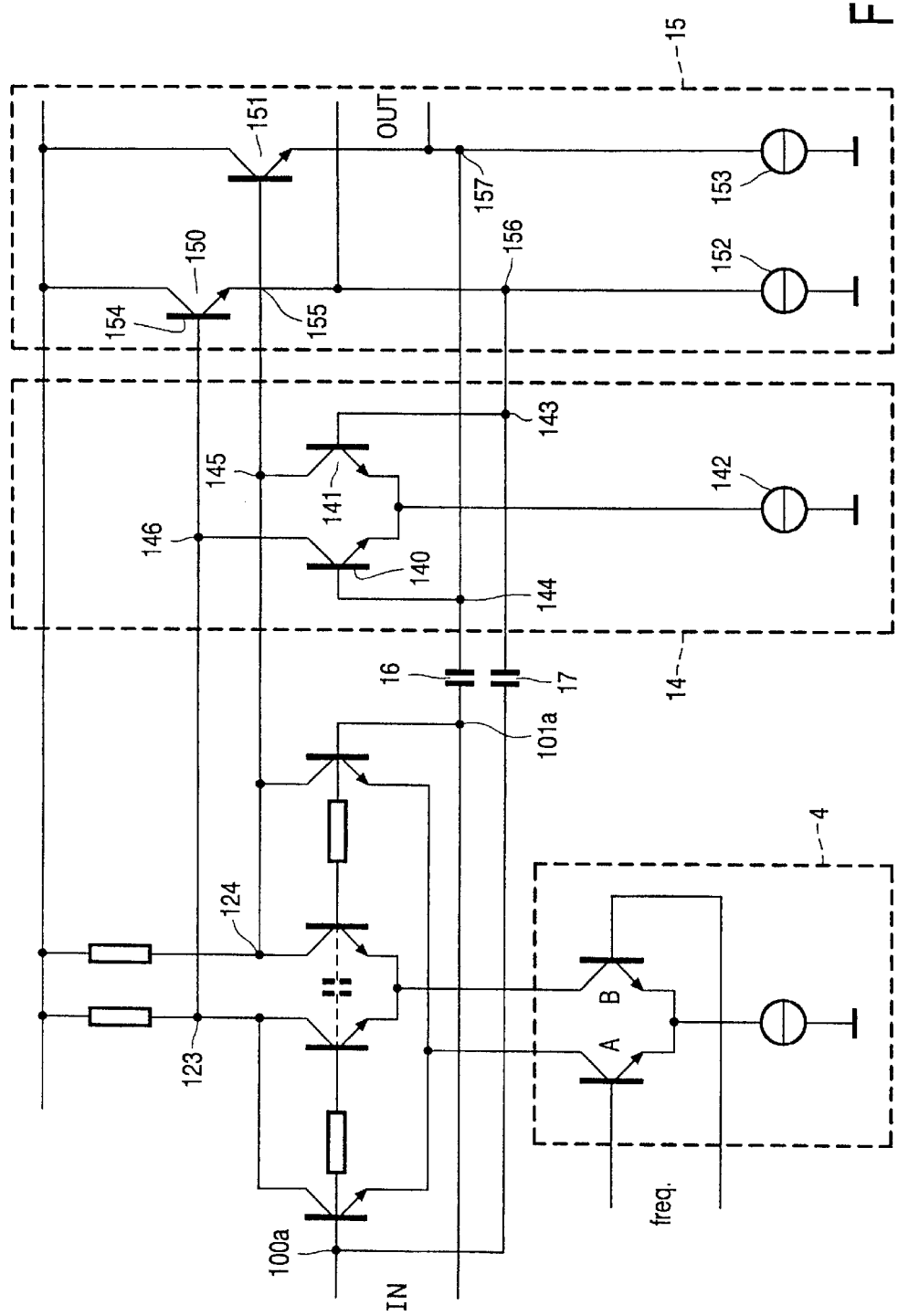
FIG. 3 shows in more detail a portion of another embodiment of the oscillator according to the invention.

FIG. 3 shows in more detail a module of the ring oscillator according to a further embodiment. The module shown therein further comprises a buffer stage 15. The buffer stage has a first and a second input 154, 155 coupled to the first and the second common node 123, 124, and a first and a second output 156, 157. The module comprises a further auxiliary amplifier stage 14 having inputs 143, 144 coupled to the outputs 156, 157 of the buffer stage 15 and having outputs 145, 146 coupled to the inputs 154, 155 of the buffer stage 15. The buffer stage 15 and the further auxiliary amplifier stage 14 together function as a latch. This improves the gain of the module during switching.

The outputs 156, 157 of the buffer stage 15 are capacitively coupled back to the inputs 100a, 101a of the module. This feedback is realised with feedback capacitors 16, 17.

Figure 4:
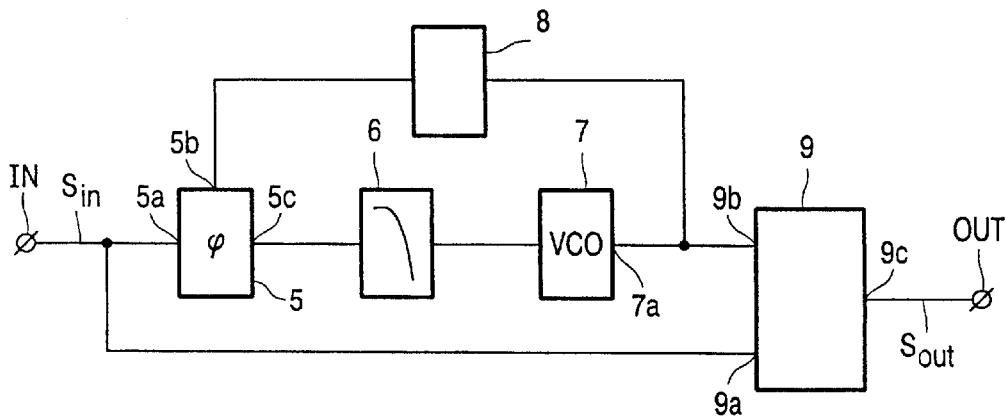
FIG. 4 shows an application of a ring oscillator according to the invention in a signal detector.

FIG. 4 shows application of the ring oscillator according to the invention in a signal detector. The signal detector comprises a phase detector 5 having a first input 5a coupled to an input IN of the signal detector. The phase detector 5 has a second input 5b and has an output 5c coupled to a controllable oscillator 7 according to the invention. For example the embodiment as described with reference to FIGS. 1 and 2 or with reference to FIGS. 1 and 3 is used. The controllable oscillator 7 is coupled to the phase detector 5 via a low pass filter 6. The second input 5b of the phase detector 5 is coupled to an output 7a of the controllable oscillator 7 via feedback means 8. The signal detector further comprises a data detecting unit 9 for generating a sampled output signal Sout. The data detecting unit 9 has a first input 9a coupled to the input IN of the signal detector and a second input 9b coupled the output of the controllable oscillator 7.

Figure 5:
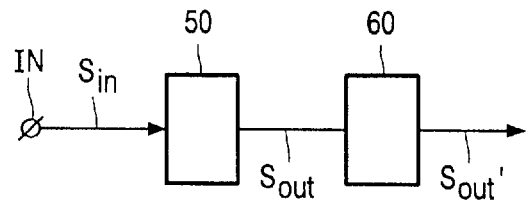
FIG. 5 shows an application of the signal detector of FIG. 4 in a transmission channel.

A signal detector as shown in FIG. 4 may be advantageously used in several applications, for example in a receiver for a transmission channel as shown in FIG. 5. The receiver shown therein comprises an input IN for receiving an input signal, a signal detector 50 as described with reference to FIG. 4 for reproducing a binary signal Sout from the input signal Sin. The receiver further comprises a circuitry module 60 for generating an output information signal Sout' from the binary signal Sout by channel decoding and/or error correction decoding.

Figure 6:
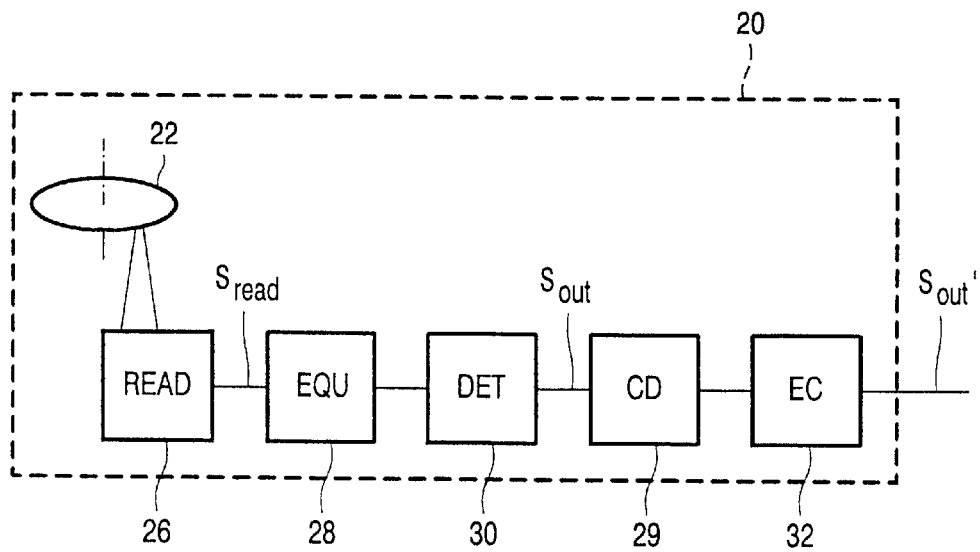
FIG. 6 shows an application of the signal detector of FIG. 4 in a device for reproducing an information carrier.

FIG. 6 further shows a device for reproducing an information carrier in which a ring oscillator according to the invention is used. The device comprises a read head 26 for reproducing a read signal Sread from a physically detectable pattern in tracks at the information carrier 22. It also comprises movement means (not shown) for causing a relative movement between the information carrier 22 and the read head 26. The movement means may for example comprise a spindle motor for tangentially moving the information carrier 22, and a sledge for radially moving the read head. The device shown comprises a detector 30 according to the invention for reproducing a binary signal Sout from the read signal Sread. To that end the read signal Sread is first processed by an equalizer 28. The device further comprises a module, for generating an output information signal Sout' from the binary signal by channel decoding and/or error correction decoding. In this case the device comprises a channel decoding module 29 and an error correction module 32.

What is claimed is:

1. A ring oscillator comprising a closed ham of at least two modules (1, 2), characterised in that at least one of the modules (1, 2) comprises a primary (10) and a secondary amplifier stage (11) and combination mea a (12) for combining output signals of the primary (10) and t e secondary amplifier stage (11) so as to generate an output signal of the module, the amplifier stages (10, 11) having a mutually different delay, the primary (10) and the secondary amplifier stage (11) each being coupled to an input (13) of the module (l), the ring oscillator further comprising a control unit (4) for generating a first (C1) and a second auxiliary control signal (C2) for controlling the amplification of the primary amplifier stage (10) and the secondary amplifier stage (11) in response to an input control signal (Co) representative for a desired frequency for the ring oscillator, characterized in that the primary amplifier stage (10) and the secondary amplifier stage (11) are formed by differential amplifiers, the secondary amplifier at stage (11) having a first (110a) and a second input (111a) which is a coupled via a first (112) and a second delay means (113) to a first (100a) and a second input (101a) of the primary amplifier stage (10), each of the differential amplifiers being supplied by a respective branch (43, 44) of an auxiliary differential amplifier (4), which is supplied by a current source (45), wherein the differential amplifiers of the primary (10) and the secondary a litter stage (11) each have a first (100c, 110c) and a second output (101c, 111c), the combination means (12) being formed by first common node (123) which connects the first outputs (100c, 110c) and a second common node (124) which connects the second outputs (101c, 111c).

2. A ring oscillator according to claim 1, characterized in that the secondary amplifier stage (11) include a delay means (112, 113).

3. A ring oscillator according to claim 2, characterized in that, the secondary amplifier stage (11) comprises a first and a second semiconductor element (110, 111), and that t e delay means are formed by resistive elements (112, 113).

4. A ring oscillator according to claim 1, wherein the at least one module (1) further comprises a buffer stage (15) having a first (154) and a second input (155) coupled to the first (123) and the second common node (124), d a first (156) and a second output (157), the module comprising a further auxiliary amplifier stage (14) having inputs (143, 144) coupled to the outputs (156, 157) of the buffer stage (15) an having outputs (145, 146) coupled to the inputs (155, 154) of the buffer stage (15).

5. A ring oscillator according to claim 4, characterized in that the outputs (156, 157) of the buffer stage (15) are capacitively coupled back to the inputs (100a, 101a) of the module.

6. A date and clock recovery unit DCR cc rising a phase detector (5) having a first input (5a) coupled to a input (IN) of the DCR, the phase detector (5) having a second input (5b) and having an output (5c) coupled to a ring oscillator (7) according to one of the previous claims, the second input (5b) of the phase detector (5) being coupled to an output of the controllable oscillator (7) via feedback means (8), the DCR further comprising a data detecting unit (9) for generating a sampled output signal (Sout) having a first input (9a) coupled to the input (IN) of the DCR and a second input (9b) coupled the output (7a) of the ring (7).

7. A receiver for a transmission channel having an input (IN) for receiving an input signal (Sin), & DCR (50)

according to claim 6, for reproducing a binary signal (Sout) from the input signal (Sin) and a circuitry module (60) for generating an output information signal (Sout') from the binary signal (Sout) by channel decoding and/or error correction decoding.

8. A device for reproducing an information carrier (22) comprising a read head (26) for reproducing a read signal (Sread) from a physically detectable pattern in tracks at t e information carrier (22), movement means for causing a relative movement between the information carrier (22) and the read head (26), a DCR according to claim 6, for reproducing a binary signal (Sout) from the read signal (Sread), and a module (29, 32) for generating an output information signal (Sout') from the binary signal by channel decoding and/or error correction decoding.

* * * * *